US012658077B2

(12) United States Patent
Chen et al.

(10) Patent No.:  US 12,658,077 B2
(45) Date of Patent:  Jun. 16, 2026

(54) SPLICING DISPLAY DEVICE

(71) Applicant: AUO Corporation, Hsinchu City (TW)

(72) Inventors: Hsin Han Chen, Hsinchu City (TW);
Wen-Lin Cheng, Hsinchu City (TW);
Yen-Ti Huang, Hsinchu City (TW)

(73) Assignee: AUO Corporation, Hsinchu City (TW)

( * ) Notice: Subject to any disclaimer, the term of this patent is extended or adjusted under 35 U.S.C. 154(b) by 0 days.

(21) Appl. No.: 19/183,941

(22) Filed: Apr. 21, 2025

(65) Prior Publication Data

US 2026/0024471 A1      Jan. 22, 2026

(30) Foreign Application Priority Data

Jul. 18, 2024    (TW) ................................. 113126943

(51) Int. Cl.
*G09F 9/302* (2006.01)
*H10H 29/34* (2025.01)
*H10K 59/18* (2023.01)
*H10K 59/35* (2023.01)

(52) U.S. Cl.
CPC .......... *G09F 9/3026* (2013.01); *H10H 29/34* (2025.01); *H10K 59/18* (2023.02); *H10K 59/353* (2023.02)

(58) Field of Classification Search
CPC ...... G09F 9/3026; H10H 29/34; H10K 59/18; H10K 59/353
See application file for complete search history.

(56) References Cited

U.S. PATENT DOCUMENTS

| | | | | |
|---|---|---|---|---|
| 5,369,281 | A | * | 11/1994 | Spinnler .................. H04N 9/12 |
| | | | | 257/443 |
| 11,652,077 | B2 | | 5/2023 | Su et al. |
| 2024/0224438 | A1 | * | 7/2024 | Zhao ....................... G09F 9/302 |
| 2024/0314944 | A1 | * | 9/2024 | Guo ..................... H05K 5/0217 |
| 2025/0257567 | A1 | * | 8/2025 | Babinsky .......... B32B 17/10146 |
| 2025/0257576 | A1 | * | 8/2025 | Babinsky .......... E04F 15/02405 |

FOREIGN PATENT DOCUMENTS

| | | |
|---|---|---|
| CN | 113357494 | 9/2021 |
| CN | 112530926 | 4/2023 |
| CN | 116013155 | 4/2023 |

* cited by examiner

*Primary Examiner* — Jeff Piziali

(74) *Attorney, Agent, or Firm* — JCIPRNET

(57) ABSTRACT

A splicing display device includes multiple display modules. Each of the display modules includes a display panel, a frame, a plate body, an elastic element, and a locking element. The frame is disposed on the back of the display panel. The plate body is located on an outside edge of the frame. The elastic element is disposed between the plate body and the frame. The locking element passes through the plate body and the elastic member to be fixed to the frame, where the plate bodies of two adjacent display modules are disposed opposite to each other.

10 Claims, 10 Drawing Sheets

SPLICING DISPLAY DEVICE

CROSS-REFERENCE TO RELATED APPLICATION

This application claims the priority benefit of Taiwan application serial no. 113126943, filed on Jul. 18, 2024. The entirety of the above-mentioned patent application is hereby incorporated by reference herein and made a part of this specification.

BACKGROUND

Technical Field

The disclosure relates to a display device, and in particular to a splicing display device.

Related Art

As the applications of display devices gradually diversify, large display boards configured to display public information or advertisements have become increasingly common in major exhibition venues or department stores. In order to reduce the setup and maintenance costs of large display boards, splicing display devices composed of multiple display panels have become one of the common installation manners for such large display boards.

Generally, in order to avoid forming splicing seams in the splicing display device, the display panels (such as light emitting diode panels) need to be arranged closely. However, the edges of frameless display panels are unprotected. During the splicing and assembly process, there is a high risk of hitting the edges of the display panels, resulting in panel breakage or damage.

SUMMARY

The disclosure provides a splicing display device which may improve a collision problem at an edge of a display panel.

A splicing display device of the disclosure includes multiple display modules. Each of the display modules includes a display panel, a frame, a plate body, an elastic element, and a locking element. The frame is disposed on the back of the display panel. The plate body is located on an outside edge of the frame. The elastic element is disposed between the plate body and the frame. The locking element passes through the plate body and the elastic element to be fixed to the frame, where the plate bodies of two adjacent display modules are disposed opposite to each other.

DESCRIPTION OF THE EMBODIMENTS

Figure 1:
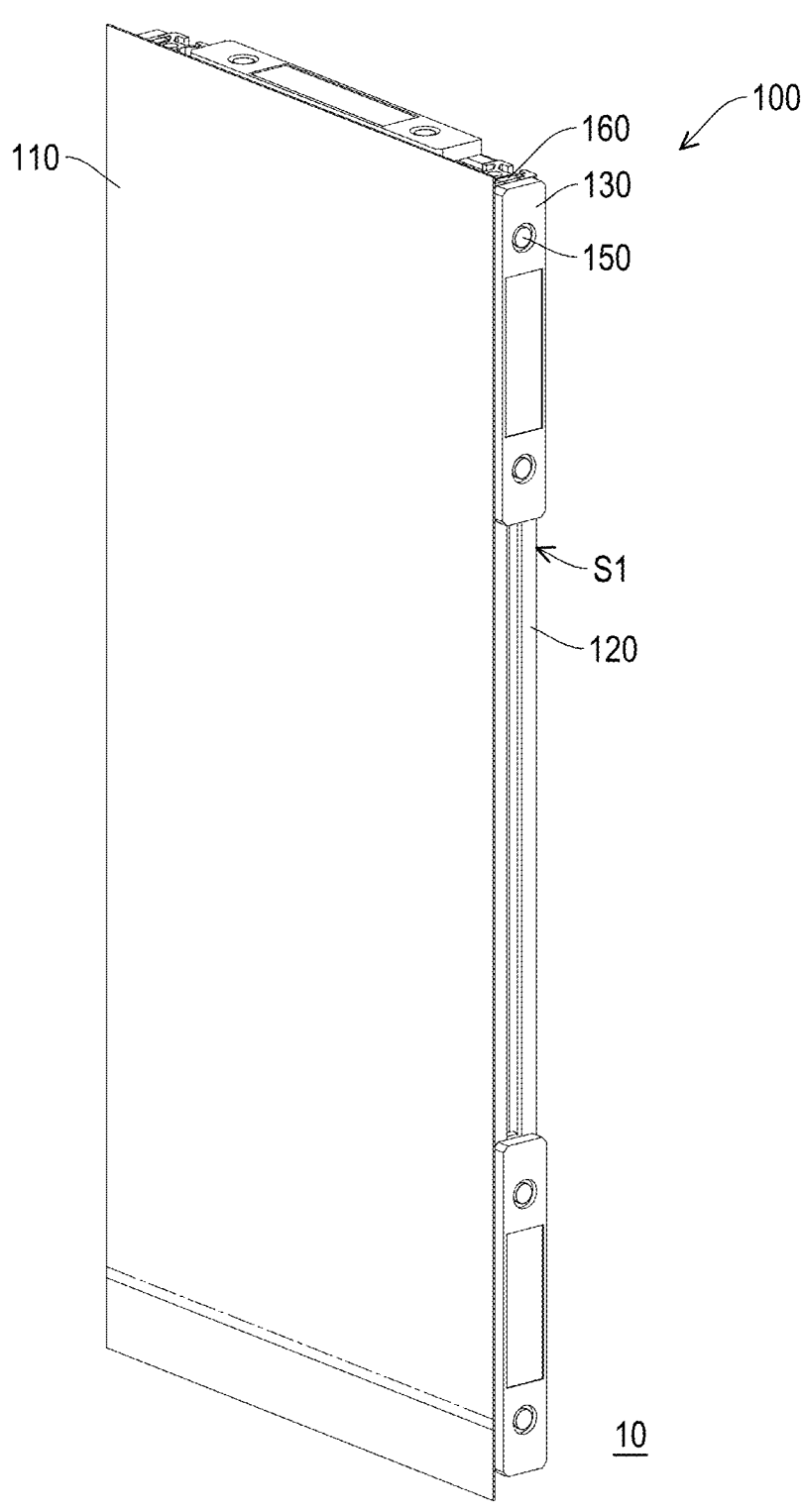
FIG. 1 is a three-dimensional schematic view of a splicing display device according to an embodiment of the disclosure.

Reference will now be made in detail to exemplary embodiments of the disclosure, examples of which are illustrated in the accompanying drawings. Wherever possible, the same reference numerals are used in the drawings and descriptions to refer to the same or similar parts.

It should be understood that when an element such as a layer, a film, a region or a substrate is referred to as being "on" or "connected" to another element, it may be directly on or connected to another element, or intervening elements may also be present. In contrast, when an element is referred to as being "directly on" or "directly connected to" another element, there are no intervening elements present. As used herein, "connection" may refer to a physical and/or electrical connection. In addition, an "electrical connection" or "coupling" may be another element between two elements.

In addition, relative terms such as "below" or "bottom" and "above" or "top" may be used herein to describe a relationship of one element to another element as shown in the figures. It should be understood that the relative terms are intended to encompass different orientations of the device in addition to the orientation depicted in the figures. For example, if the device in a figure is turned over, elements described as being on the "below" side of other elements would be oriented on the "above" side of the other elements. Thus, the exemplary term "below" may encompass both "below" and "above" orientations, depending on the particular orientation of the figure. Similarly, if the device in a figure is turned over, elements described as "beneath" or "below" other elements would be oriented "above" the other elements. Thus, the exemplary terms "above" or "below" may encompass both above and below orientations.

As used herein, "about," "approximately," or "substantially" includes the stated value and an average value within an acceptable deviation range determined by a person having ordinary skill in the art, considering the particular amount of the measurements and measurement-related errors discussed (i.e., limitations of the measurement system). For example, "about" may indicate within one or more standard deviations of the stated value, or within ±30%, ±20%, ±10%, ±5%. Furthermore, "about," "approximately," or "substantially" as used herein may select a more acceptable deviation range or standard deviation according to optical properties, etching properties, or other properties, and may not use one standard deviation applicable to all properties.

Reference is made herein to cross-sectional views as schematic illustrations of idealized embodiments to describe exemplary embodiments. Therefore, variations from the shapes of the illustrations may be expected as a result of, for example, manufacturing techniques and/or tolerances. Thus, embodiments described herein should not be construed as limited to the particular shapes of regions as illustrated herein but include, for example, shape deviations resulting from manufacturing. For example, a region shown or described as flat may typically have rough and/or nonlinear features. Moreover, sharp angles that are illustrated may be rounded. Thus, the regions illustrated in the figures are schematic in nature, and shapes thereof are not intended to illustrate the precise shape of a region and are not intended to limit the scope of the claims.

Unless otherwise defined, all terms (including technical and scientific terms) used herein have the same meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

FIG. 1 is a three-dimensional schematic view of a splicing display device according to an embodiment of the disclosure. Referring to FIG. 1, a splicing display device 10 of this embodiment includes multiple display modules 100. It should be noted that FIG. 1 only schematically illustrates one of the display modules for ease of description.

Figure 2A:
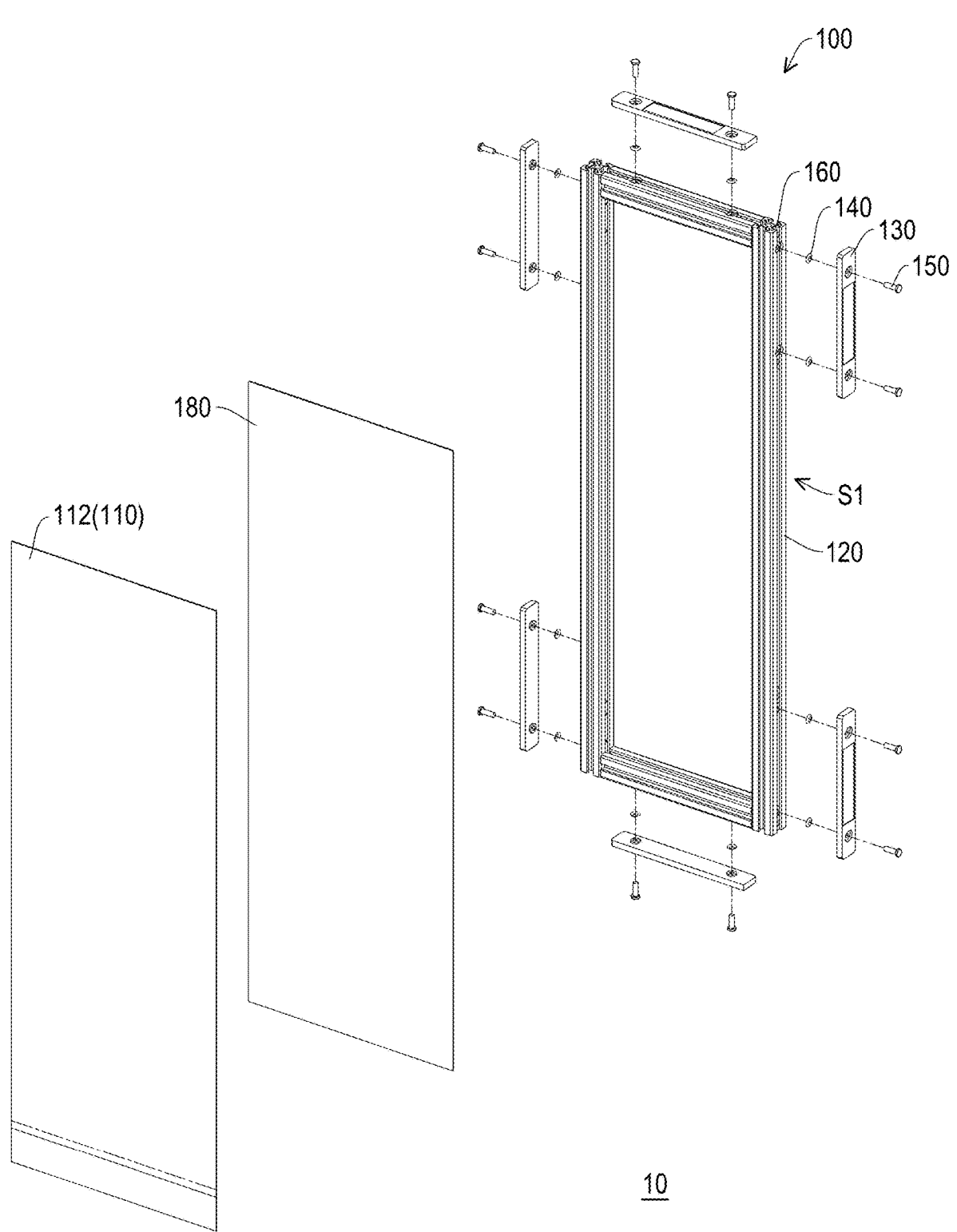
FIG. 2A is an exploded schematic view of the display module in FIG. 1.
Figure 2B:
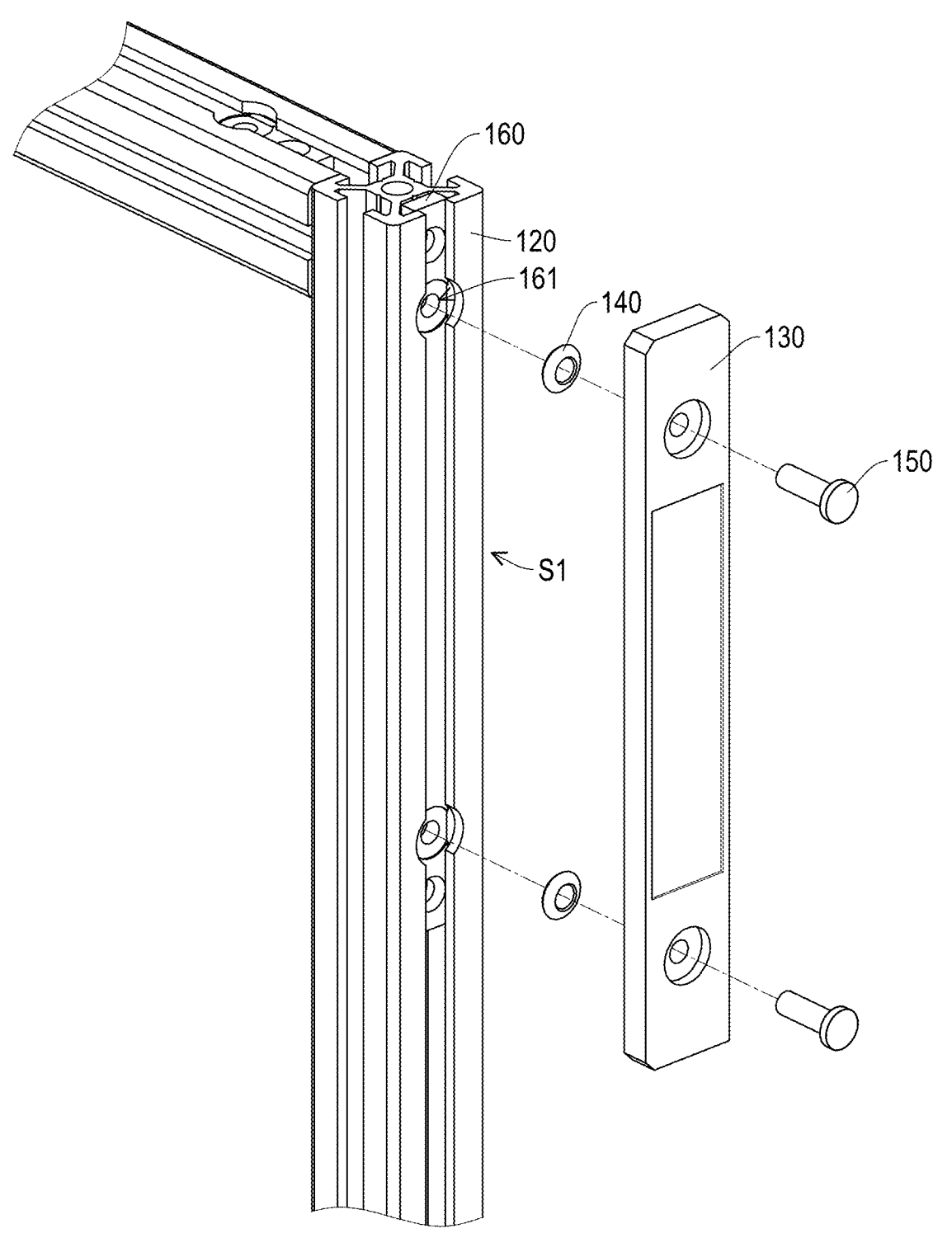
FIG. 2B is a partially enlarged view of the display module in FIG. 2A.

FIG. 2A is an exploded schematic view of the display module in FIG. 1. FIG. 2B is a partially enlarged view of the display module in FIG. 2A. Referring to FIG. 2A and FIG. 2B, each display module 100 includes a display panel 110, a frame 120, a plate body 130, an elastic element 140, and a locking element 150. In this embodiment, the frame 120 is disposed on the back of the display panel 110. The plate body 130 is located on an outside edge S1 of the frame 120. The elastic element 140 is disposed between the plate body 130 and the frame 120. The locking element 150 passes through the plate body 130 and the elastic element 140 to be fixed to the frame 120.

In this embodiment, the plate body 130 is, for example, a rectangular plate body, and its length and width may be appropriately adjusted according to the dimensions of the frame 120, which is not limited by the disclosure.

In this embodiment, the frame 120 is modular and includes multiple frame bars, and a number of plate bodies 130 is set to be multiple. In an embodiment, the same number of plate bodies 130 is disposed on opposite frame bars, but this is not limited thereto. In some embodiments, the number of plate bodies 130 may be appropriately adjusted according to the dimensions of the display panel 110, which is not limited by the disclosure.

Under the aforementioned configuration manner, the plate body 130 on the frame 120 protrudes around the display panel 110 to protect the periphery of the display panel 110 from collision during a splicing process.

Furthermore, referring to FIG. 2A, in this embodiment, the splicing display device 10 further includes a backboard 180, and the display panel 110 further includes a glass substrate 112. The backboard 180 is located between the frame 120 and the glass substrate 112.

In some embodiments, the display panel 110 is, for example, a light emitting diode display panel, which is not limited by the disclosure. In some embodiments, the display panel 110 is, for example, an organic light emitting diode display panel, which is not limited by the disclosure.

Referring to FIG. 2B, in this embodiment, the splicing display device 10 further includes a positioning element 160. The positioning element 160 is disposed inside the frame 120. The elastic element 140 is located between the positioning element 160 and the plate body 130.

In this embodiment, the positioning element 160 has a position hole 161. In some embodiments, the position hole 161 is, for example, a screw hole, the locking element 150 is, for example, a screw, and the elastic element 140 is, for example, a spring. The locking element 150 passes through the plate body 130 and the elastic element 140 to lock into the position hole 161, but is not limited thereto.

Figure 2C:
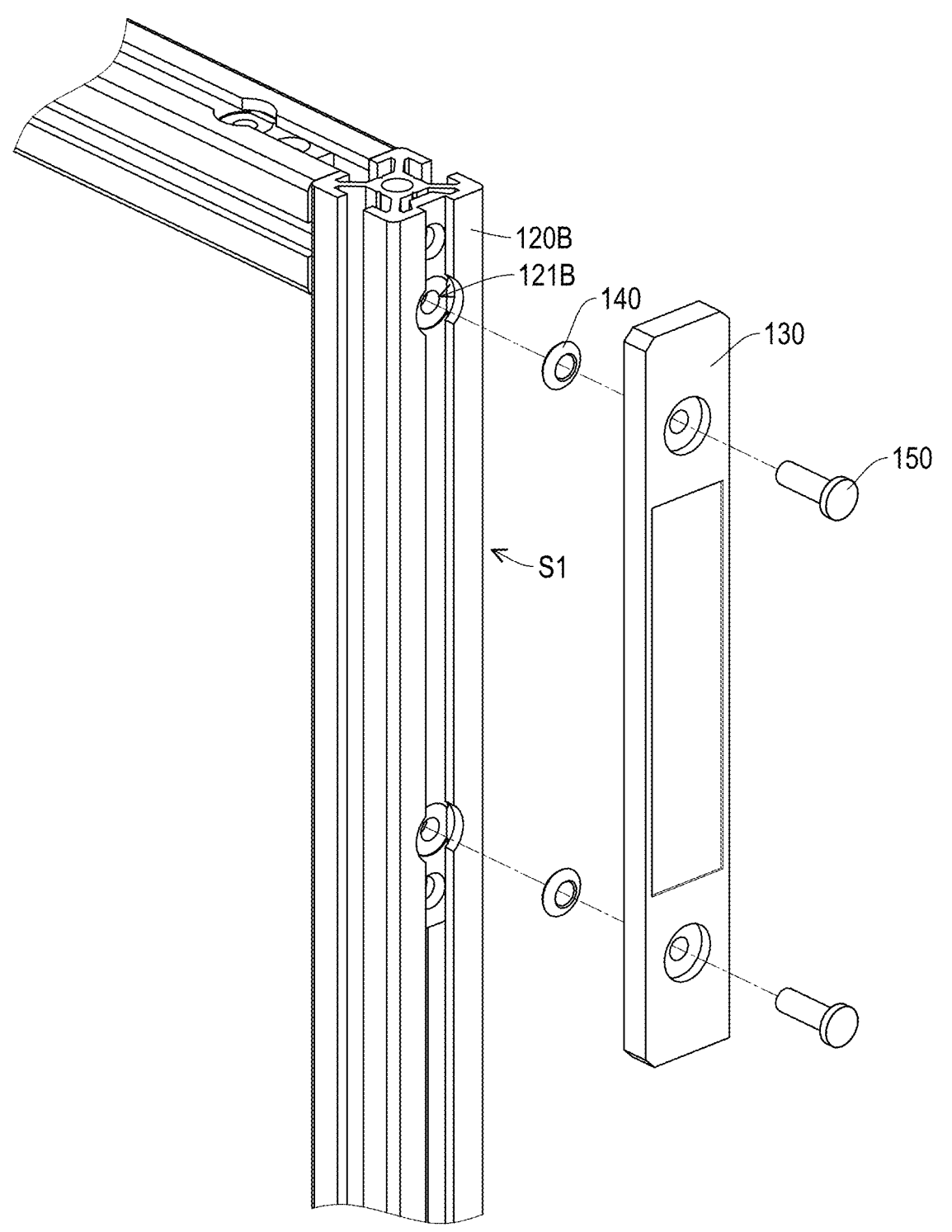
FIG. 2C is a partially enlarged exploded schematic view of a splicing display device according to an embodiment of the disclosure.

In this embodiment, the positioning element 160 is embedded in the frame 120, and the positioning element 160 and the frame 120 are a two-piece assembly, but the disclosure is not limited thereto. FIG. 2C is a partially enlarged exploded schematic view of a splicing display device according to an embodiment of the disclosure. Referring to FIG. 2C, in an embodiment, the frame 120B itself is set with a lock hole 121B, configured to lock with the locking element 150. In other words, the positioning element 160 and the frame 120 in FIG. 2B may be an integrally formed structure, which is not limited by the disclosure.

Figure 3:
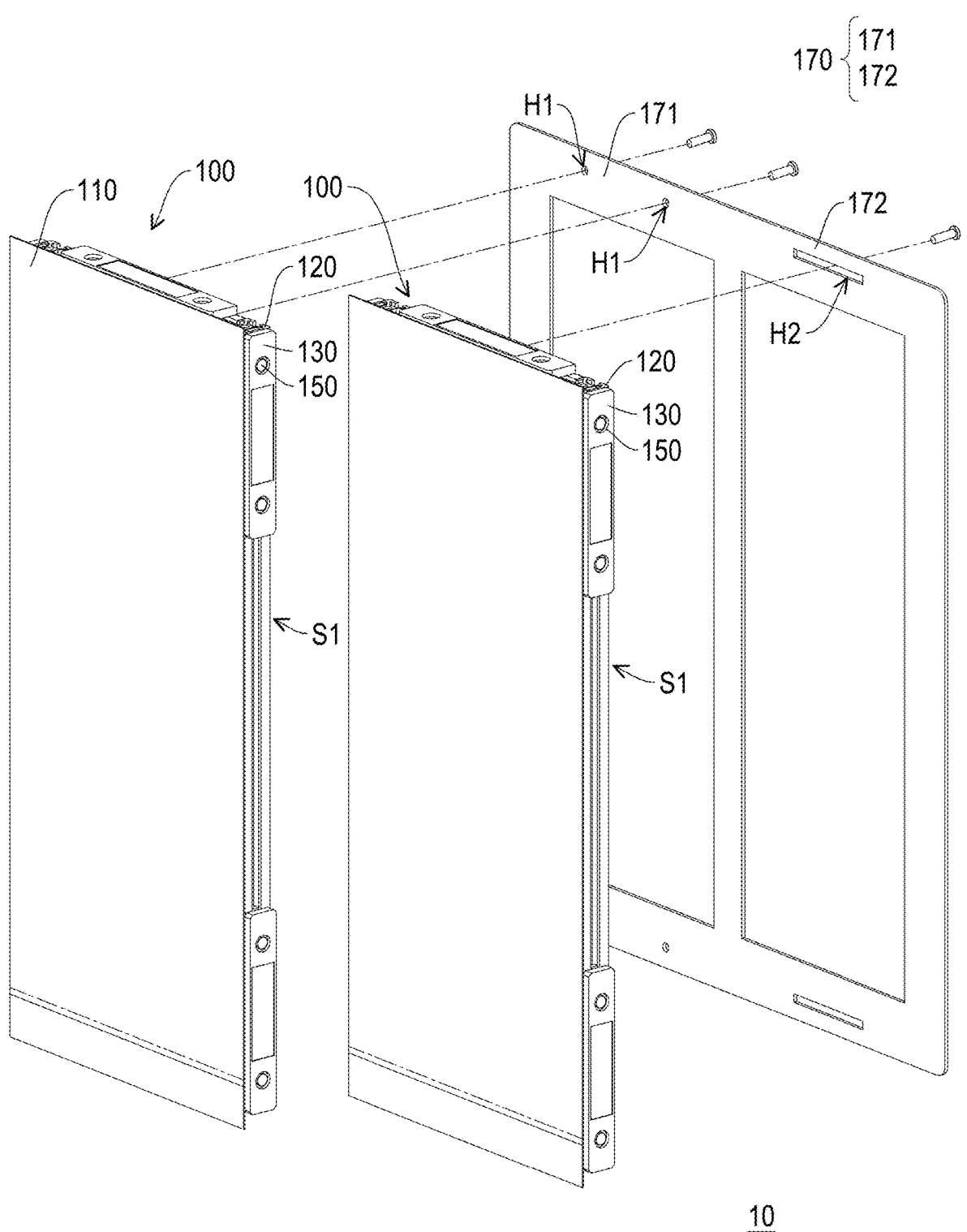
FIG. 3 is a splicing schematic view of the splicing display device in FIG. 1.

FIG. 3 is a splicing schematic view of the splicing display device in FIG. 1. Referring to FIG. 3, in this embodiment, the splicing display device 10 further includes a bracket 170, configured to splice the display modules 100. For example, the bracket 170 includes an adjacent first bracket 171 and second bracket 172. The first bracket 171 and the second bracket 172 are integrally formed sheet metal elements, but are not limited thereto. In this embodiment, one of the two adjacent display modules 100 is fixed to the first bracket 171 through the corresponding frame 120, and the other one of the two adjacent display modules 100 is slidably connected to the second bracket 172 through the corresponding frame 120. A connection manner between the frame 120 and the bracket 170 may, for example, be through screw locking, but is not limited thereto.

In detail, in this embodiment, the bracket 170 has relatively upper and lower sides, the first bracket 171 has multiple round holes H1 located on the upper and lower sides respectively, and the second bracket 172 has a slotted hole H2 located on the upper and lower sides respectively, but is not limited thereto.

In this way, the round holes H1 may fix the display module 100 on the left side of the figure, while the slotted hole H2 allows the display module 100 on the right side of the figure to move horizontally, facilitating the operator to adjust the display module 100 to an appropriate position.

Figure 4A:
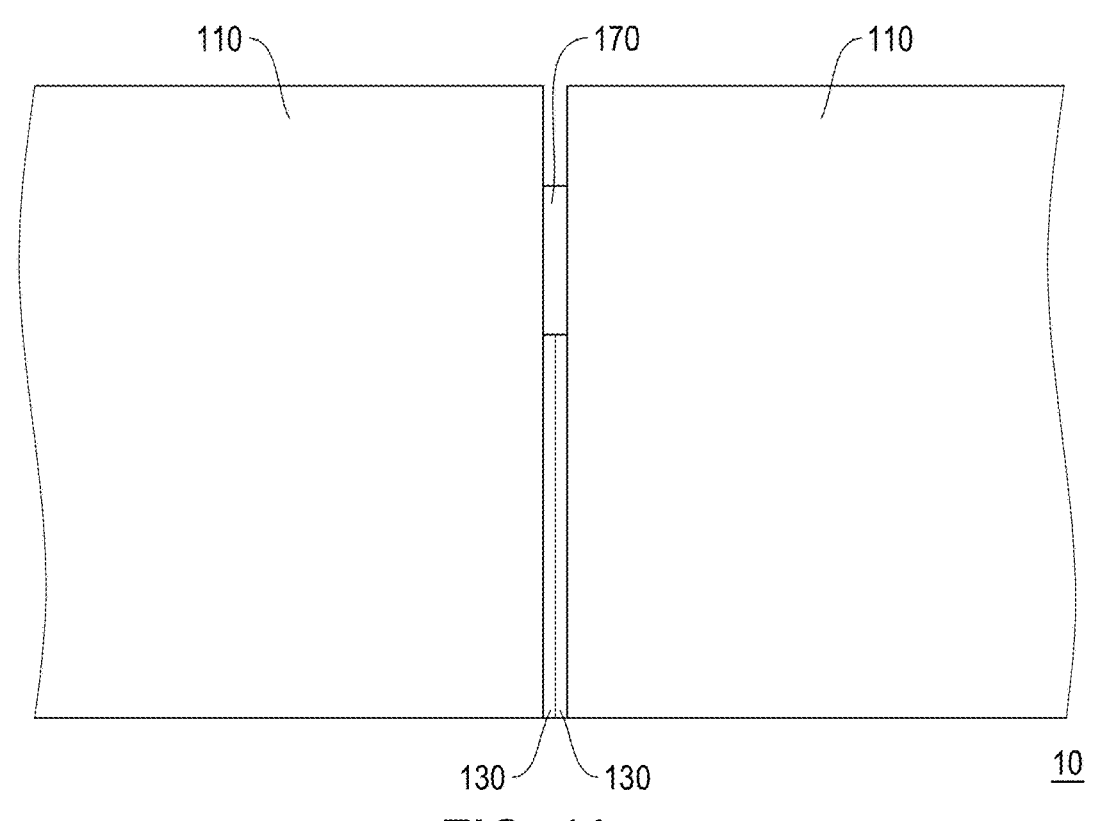
FIG. 4A is a front schematic view of a splicing display device according to an embodiment of the disclosure.
Figure 4B:
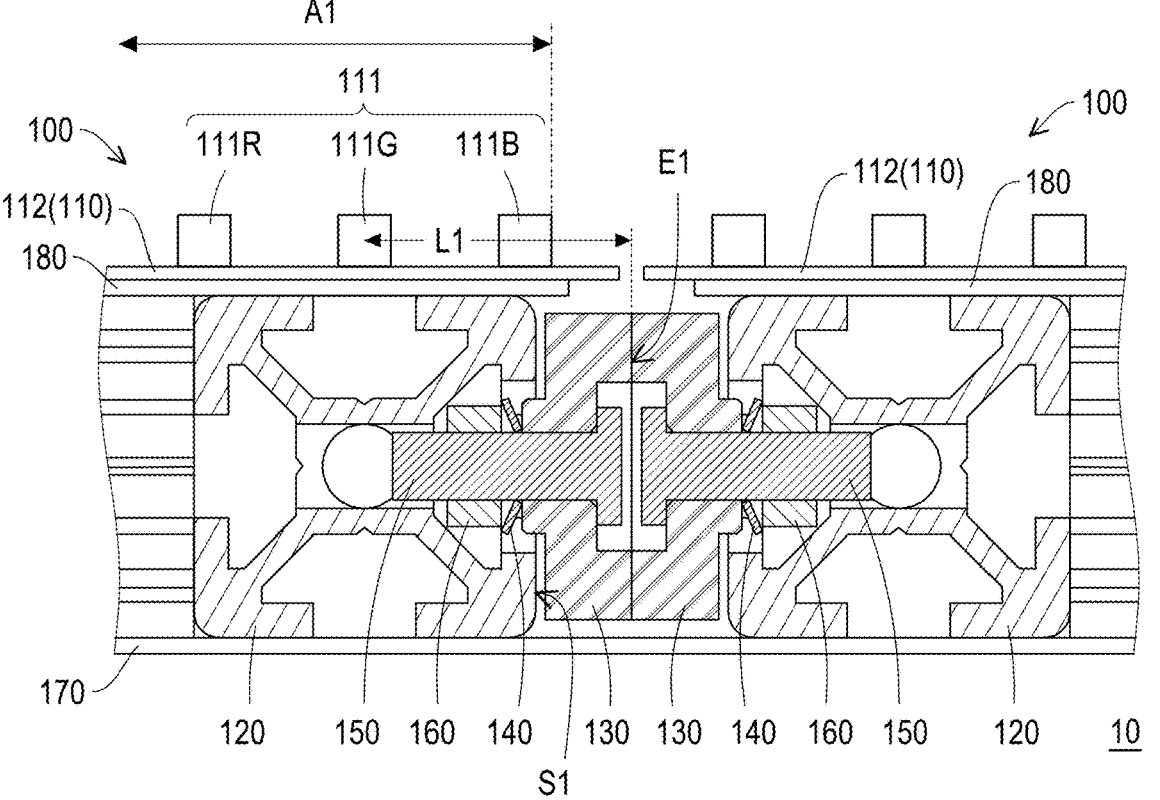
FIG. 4B is a side view of the splicing display device in FIG. 4A.
Figure 4C:
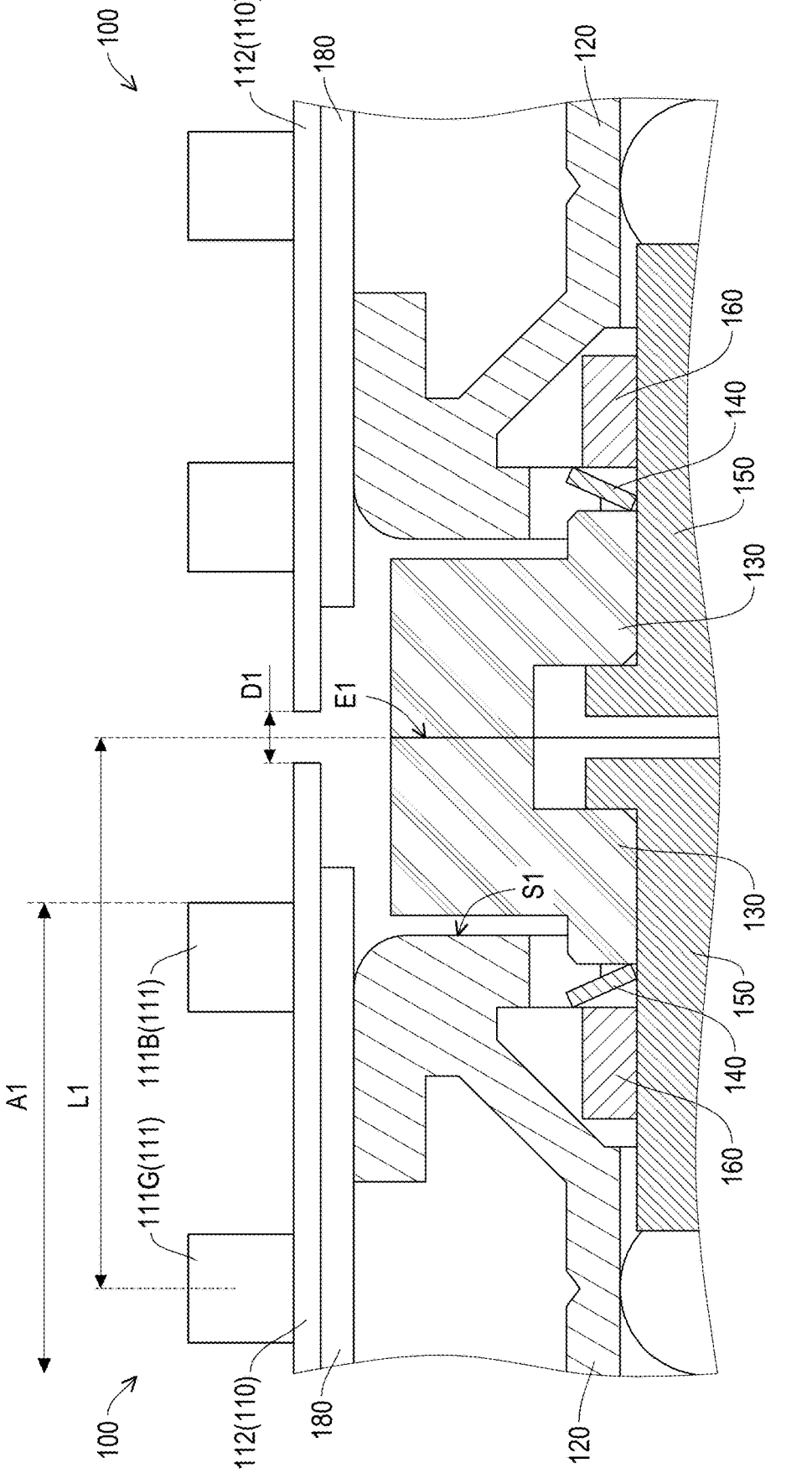
FIG. 4C is a partially enlarged schematic view of the splicing display device in FIG. 4B.
Figures 5A, 5B:
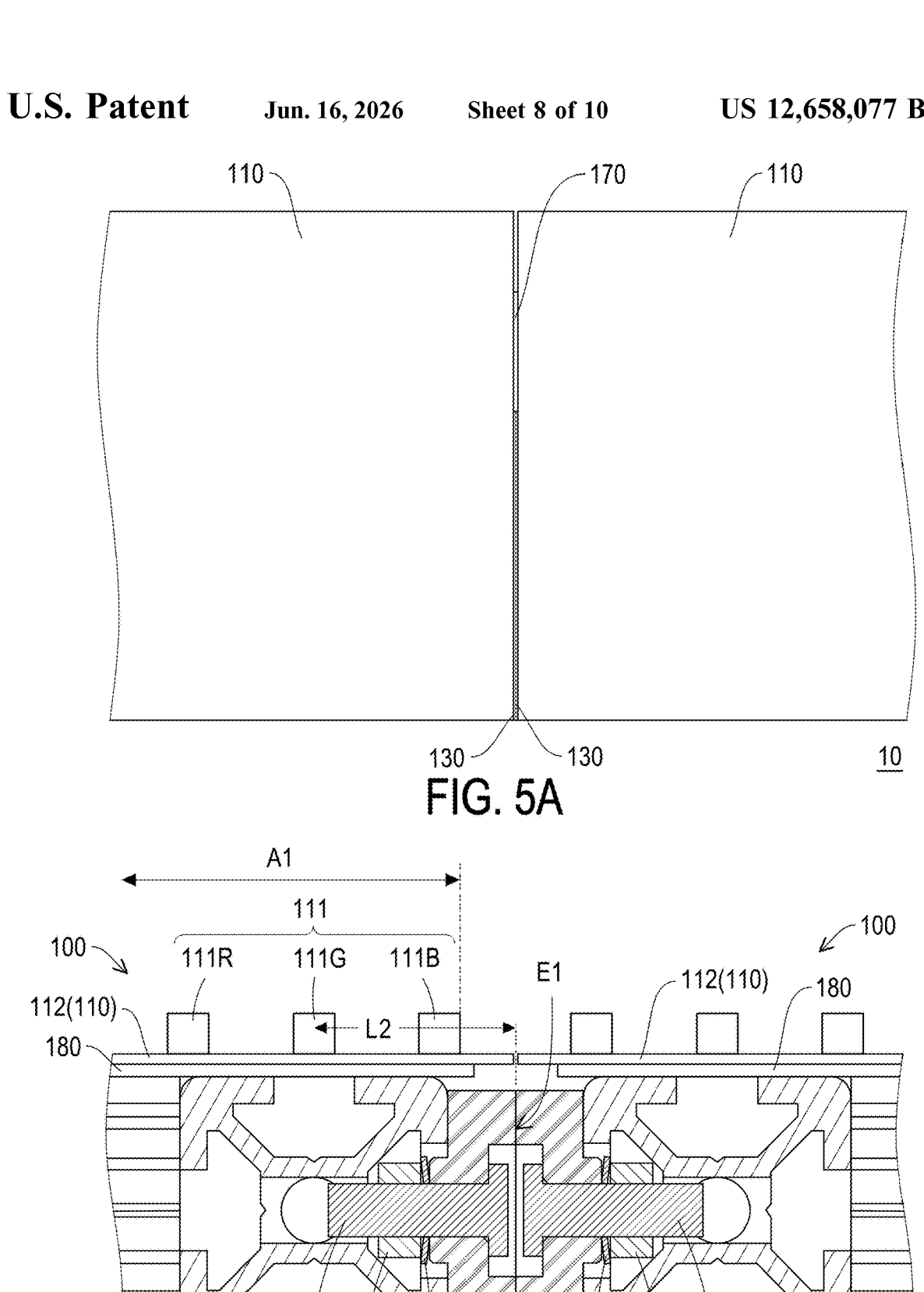
FIG. 5A is a front schematic view of a splicing display device according to an embodiment of the disclosure.
FIG. 5B is a side view of the splicing display device in FIG. 5A.
Figure 5C:
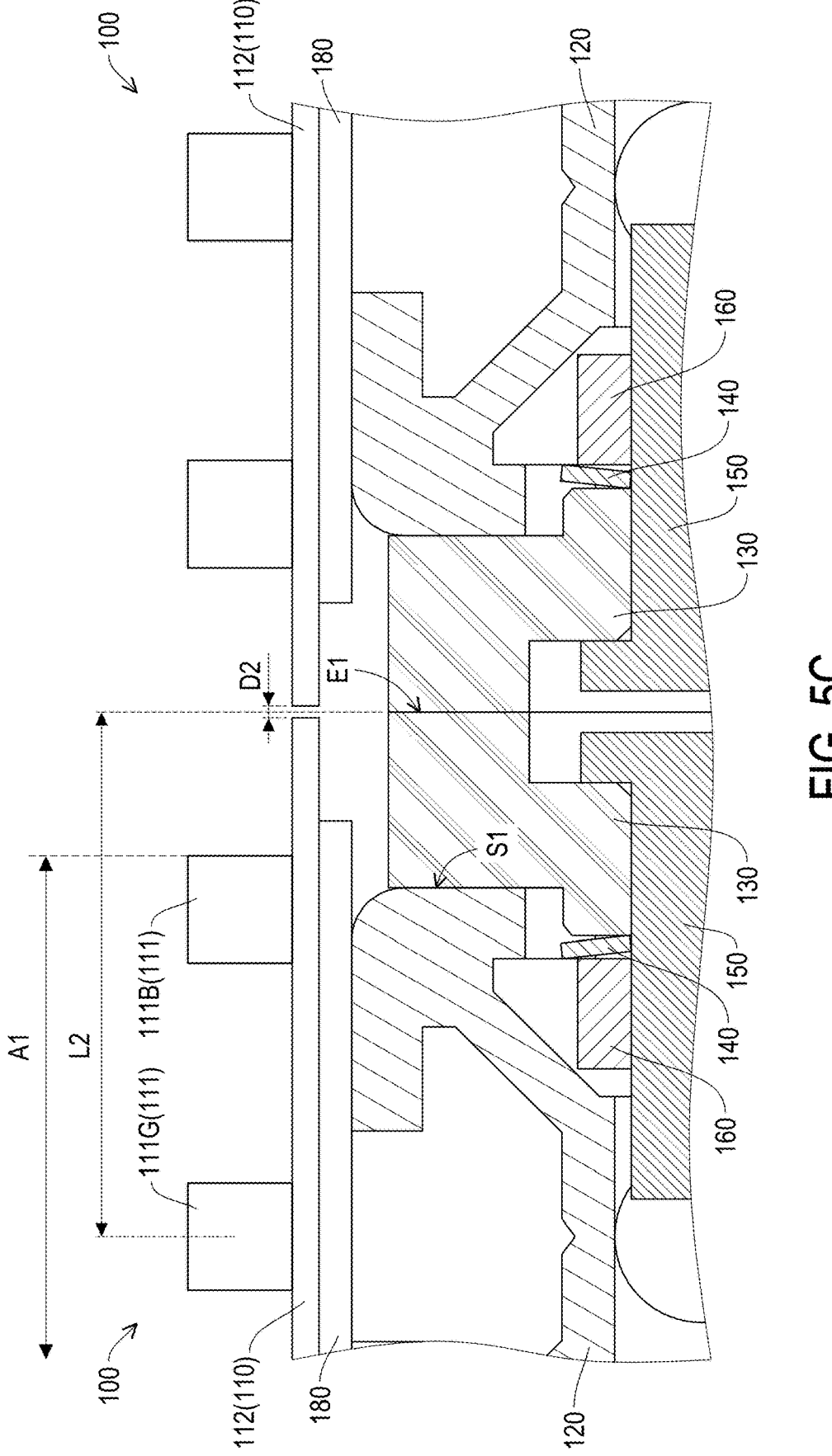
FIG. 5C is a partially enlarged schematic view of the splicing display device in FIG. 5B.

FIG. 4A is a front schematic view of a splicing display device according to an embodiment of the disclosure. FIG. 4B is a side view of the splicing display device in FIG. 4A. FIG. 4C is a partially enlarged schematic view of the splicing display device in FIG. 4B. FIG. 5A is a front schematic view of a splicing display device according to an embodiment of the disclosure. FIG. 5B is a side view of the splicing display device in FIG. 5A. FIG. 5C is a partially enlarged schematic view of the splicing display device in FIG. 5B.

Referring to FIG. 4A and FIG. 5A first, in this embodiment, the plate bodies 130 of the two adjacent display modules 100 are disposed opposite to each other, and a distance between the two adjacent display modules 100 may be adjusted by adjusting the protrusion degree of the plate body 130 relative to the four sides of the display panel 110. In some embodiments, the locking elements 150 of two adjacent display modules 100 are not in contact with each other.

In detail, referring to FIG. 4B and FIG. 5B, in this embodiment, the display panel 110 includes multiple pixel units 111. The pixel units 111 are formed on the glass substrate 112. Specifically, the pixel units 111 are located in a display area A1. Each pixel unit 111 may include a first light emitting element 111R, a second light emitting element 111B, and a third light emitting element 111G. The first light emitting element 111R, the second light emitting element 111B, and the third light emitting element 111G are, for example, red light, blue light, and green light respectively, but the disclosure is not limited thereto. In an embodiment, the light emitting element may be a light emitting diode (LED), but is not limited thereto.

Referring to FIG. 4B and FIG. 4C, in an embodiment, the third light emitting element 111G is located between the first light emitting element 111R and the second light emitting element 111B. The third light emitting element 111G is defined as a pixel center and forms a protrusion length L1 with an edge E1 of the plate body 130. Here, the third light emitting element 111G of the pixel unit 111 is the pixel center closest to an edge of the display area A1. In some embodiments, the protrusion length L1 does not exceed ½ times a pixel pitch, to ensure that no splicing lines (bright lines or dark lines) appear on the display screen. In some embodiments, the pixel pitch is 732 μm, and a value of the protrusion length L1 should be designed to be approximately ½ times a pixel pitch, for example, 366 μm, but the disclosure is not limited thereto.

In some embodiments, the adjustable protrusion length is greater than or equal to 0.45 times the pixel pitch between pixel units 111 and less than or equal to 0.55 times the pixel pitch between the pixel units 111, to ensure that no splicing lines appear, such as bright lines or dark lines.

In an embodiment, when the locking element 150 moves toward the frame 120, the locking element 150 compresses the elastic element 140, to make the plate body 130 approach the outside edge S1, thereby adjusting the distance between the two adjacent display panels 110. When the locking element 150 moves away from the frame 120, the plate body 130 is reset by the elastic force of the elastic element 140 to move away from the outside edge S1.

For example, the splicing distance between the two display modules 100 may be adjusted by tightening or loosening the locking element 150 to fine-tune the plate body 130. Furthermore, referring to FIG. 4B and FIG. 4C, when the locking element 150 is not tightened, the elastic element 140 is loosened, and a protrusion amount of the plate body 130 may be increased through the elastic force of the elastic element 140. At this time, there is a protrusion length L1 between the pixel center (the third light emitting element 111G) and the edge E1 of the plate body 130, and there is a first distance D1 between the two adjacent display panels 110. Referring to FIG. 5B and FIG. 5C, the locking element 150 is tightened to compress the elastic element 140 and reduce the protrusion amount of the plate body 130. At this time, there is a protrusion length L2 between the pixel center (the third light emitting element 111G) and the edge E1 of the plate body 130, and there is a second distance D2 between the two adjacent display panels 110. In an embodiment, the protrusion length L1 is greater than the protrusion length L2, and the first distance D1 is greater than the second distance D2, but the disclosure is not limited thereto.

As a result, the protrusion length may be fine-tuned to make the plate body 130 protrude to protect the periphery of the display panel 110, and the two adjacent display modules 100 form an appropriate splicing distance through the corresponding plate bodies 130, thereby enhancing the image quality of the splicing display device 10.

Figure 6:
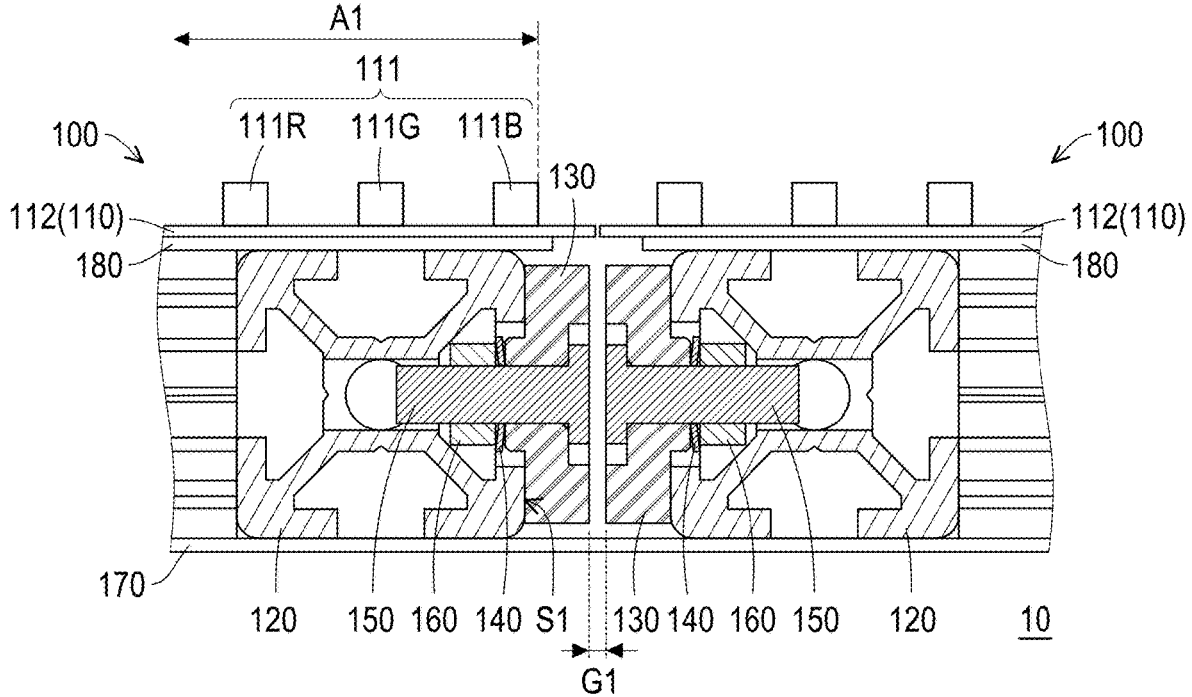
FIG. 6 is a side view of a splicing display device according to an embodiment of the disclosure.

In the aforementioned embodiment, two adjacent plate bodies 130 abut against and contact each other, but the disclosure is not limited thereto. FIG. 6 is a side view of a splicing display device according to an embodiment of the disclosure. Referring to FIG. 6, in an embodiment, the plate bodies 130 of the two adjacent display modules 100 do not contact each other. In other words, a gap G1 is formed between the two adjacent plate bodies 130, but the disclosure is not limited thereto.

In summary, in the splicing display device of the disclosure, the frame is provided behind the display panel, and the plate body is provided at the outside edge of the frame. By adjusting the protrusion degree of the plate body relative to the periphery of the display panel, the periphery of the display panel may be protected from collision, and the splicing line problem that easily occurs in the splicing display device may be improved, thereby enhancing the image quality of the splicing display device.

Although the disclosure has been disclosed in the embodiments as above, it is not intended to limit the disclosure. Any person having ordinary knowledge in the technical field may make some modifications and refinements without departing from the spirit and scope of the disclosure. Therefore, the protection scope of the disclosure shall be defined by the appended claims.

What is claimed is:

1. A splicing display device, comprising:
    a plurality of display modules, wherein each of the plurality of display modules comprises:
    a display panel;
    a frame, disposed on a back of the display panel;
    a plate body, located on an outside edge of the frame;
    an elastic element, disposed between the plate body and the frame; and
    a locking element, passing through the plate body and the elastic element to be fixed to the frame, wherein plate bodies of two adjacent display modules are disposed opposite to each other, wherein the display panel comprises a plurality of pixel units, the plurality of pixel units are located in a display area, each of the plurality of pixel units has a first light emitting element, a second light emitting element and a third light emitting element, the third light emitting element is located between the first light emitting element and the second light emitting element, the third light emitting element is defined as a pixel center and forms a protrusion length with an edge of the plate body, and the protrusion length is greater than or equal to 0.45 times a pixel pitch between the plurality of pixel units and less than or equal to 0.55 times a pixel pitch between the plurality of pixel units.

2. The splicing display device according to claim 1, wherein the two adjacent display modules abut against each other by the plate bodies.

3. The splicing display device according to claim 1, wherein a gap is formed between two adjacent plate bodies.

4. The splicing display device according to claim 1, wherein
    when the locking element moves away from the frame, the plate body is reset by an elastic force of the elastic element, to move away from the outside edge, thereby making a first distance between the two adjacent display panels, and
    when the locking element moves toward the frame, the locking element compresses the elastic element, to make the plate body approach the outside edge, thereby making a second distance between the two adjacent display panels, and the first distance is greater than the second distance.

5. The splicing display device according to claim 1, further comprising a positioning element, disposed inside the frame, and the elastic element is located between the positioning element and the plate body.

6. The splicing display device according to claim 5, wherein the positioning element has a position hole, and the locking element passes through the plate body and the elastic element to lock into the position hole.

7. The splicing display device according to claim 1, further comprising a bracket, wherein the bracket includes an adjacent first bracket and second bracket, one of the two adjacent display modules is fixed to the first bracket through a corresponding frame, the other one of the two adjacent display modules is slidably connected to the second bracket through the corresponding frame.

8. The splicing display device according to claim 7, wherein the bracket has two sides opposite to each other, the first bracket has a plurality of round holes located respectively at the two sides, the second bracket has a slotted hole located respectively at the two sides.

9. The splicing display device according to claim 1, further comprising a backboard, wherein the display panel further comprises a glass substrate, the pixel units are formed on the glass substrate, and the backboard is located between the frame and the glass substrate.

10. The splicing display device according to claim 1, wherein locking elements of two adjacent display modules are not in contact with each other.

\* \* \* \* \*